United States Patent [19]
Whitlow et al.

[11] Patent Number: 5,223,478
[45] Date of Patent: Jun. 29, 1993

[54] HOT ISOSTATIC PROCESSING OF HIGH CURRENT DENSITY HIGH TEMPERATURE CONDUCTORS

[75] Inventors: Graham A. Whitlow, Murrysville; William R. Lovic, New Kensington, both of Pa.

[73] Assignee: Westinghouse Electric Corp., Pittsburgh, Pa.

[21] Appl. No.: 707,525

[22] Filed: May 30, 1991

[51] Int. Cl.$^5$ .......................................... H01L 39/24
[52] U.S. Cl. .......................................... 505/1; 29/599; 264/570; 505/705
[58] Field of Search ............... 29/599, 402.19, 402.21; 505/1, 705, 917, 918, 919; 264/104, 570

[56] References Cited

U.S. PATENT DOCUMENTS

| | | | |
|---|---|---|---|
| 4,826,808 | 5/1989 | Yurek et al. | 501/1 |
| 4,863,804 | 9/1989 | Whitlow et al. | 428/555 |
| 5,004,722 | 4/1991 | Tallman | 29/599 X |

OTHER PUBLICATIONS

Jin et al., *Applied Physics Letters*, vol. 51, No. 3, Jul. 20, 1987, pp. 203–204.
Haldar et al., *Science*, vol. 241, Sep. 1988, pp. 1198–1200.

*Primary Examiner*—Joseph M. Gorski
*Attorney, Agent, or Firm*—Daniel P. Cillo

[57] ABSTRACT

A method to form a superconducting wire or ribbon contains the steps: (1) forming ceramic powder, (2) forming pellets from the powder, (3) inserting the pellets in a metal sheath, (4) reducing the cross-section of the sheathed pellets to form a composite, (5) sealing the composite in a deformable container, (6) hot isostatically pressing the composite at a temperature over 600° C., where the temperature is close to or just above the melting point of the core, and (7) annealing the pressed composite in a source of oxygen at a temperature from 770° C. to 870° C. for at least 40 hours.

6 Claims, 2 Drawing Sheets

HOT ISOSTATIC PROCESSING OF HIGH CURRENT DENSITY HIGH TEMPERATURE CONDUCTORS

GOVERNMENT CONTRACT CLAUSE

This invention was made with U.S. Government support under Cooperative Research and Development Agreement No. 87X-SD92SC awarded by D.O.E. The U.S. Government has certain rights in this invention.

BACKGROUND OF THE INVENTION

This invention relates to a fabrication process for superconducting wires and coils, involving isostatic pressing, and heat treating steps which result in improved critical current density properties.

Perovskite related ceramic oxides, comprising alkaline earth metal-copper oxide, such as orthorhombic yttrium-barium-copper oxide materials, usually characterized as $YBa_2Cu_3O_7$ or "1:2:3 ceramic oxides", are well-known "high temperature" superconductor materials. This 1:2:3 ceramic oxide material has been found to provide electrical superconductivity, that is, essentially no electrical resistance, at temperatures less than or in the region of 93 K.

The 1:2:3 ceramic oxides and other rare earth metal-alkaline earth metal-copper oxide based ceramics can operate in the superconducting mode near the 77 K boiling point of relatively inexpensive and plentiful liquid nitrogen, and could find increased use in composite windings for high current magnets, energy storage coils, long distance power transmission, and the like. However, 1:2:3 ceramic oxides and other superconducting ceramic oxides, generally made from sintered component oxide particles, are hard and brittle, and are not easily fabricated into fine wire or windings.

In U.S. Pat. No. 4,826,808 (Yurek et al.) a method of forming superconducting wires, rods and rings was taught, where pure metals, such as La, Ba, and Cu, which when oxidized would produce superconductors, preferably having silver, platinum, palladium or gold, added, were melted under vacuum and then melt spun to form the desired shape. Chill casting, centrifugal casting and the like were also taught to form the shape. Thermal-mechanical processing, such as wire drawing, extrusion, rolling and hot isostatic pressing, was employed to form a final, useful metal alloy shape. Then the alloy shape was oxidized, to form the alloy into the superconducting oxide, such as $LaBa_2Cu_3O_7$, containing interdispersed noble metal which improved the ductility and strength of the shape.

In a less complicated method to solve brittleness problems, Jin et al., in *Applied Physics Letters*, "High $T_c$ Superconductors Composite Wire Fabrication," Vol. 51, No. 3, Jul. 20, 1987, pp 203–204, placed a metal cladding around an already formed, heat treated, 1:2:3 ceramic oxide powder superconducting core. The metal cladding, which was Ag, or Cu with a Ni/Au oxygen diffusion barrier, allowed ease of drawing into fine wire form, from 0.6 cm to 0.02 cm diameter, and also provided an alternate electrical conduction path in case the ceramic oxide lost its superconducting properties, that is, became normal or resistive. Ag was found particularly advantageous as a cladding. The drawn wires were then annealed at 900° C. in oxygen. Multifilamentary ribbon composites were also formed.

U.S. Pat. No. 4,863,804 (Whitlow et al.) taught improved multifilamentary wire having less single filament distortion and improved dimensional uniformity. There, a sheath having a composite wall of ductile outer skin such as copper, and high strength inner wall, such as copper dispersion hardened with $Al_2O_3$, was filled with already formed pellets of superconducting material, such as $Nb_3Sn$, $Nb_3Al$, NbC, and the like. It was then rolled or drawn to a reduced cross-section, annealed, and then cold extruded to from a wire having a hexagonal cross-section. Then, bundles of the hexagonal wires, along with pure high conductivity copper wires were placed in a copper sheath and the whole consolidated by hot isostatic pressing at 900° C. for 2 hours at 1,057 kg/cm² (15,000 psi). This consolidated wire bundle was then rolled or drawn to reduce the diameter and then cold extruded.

Already formed, round or hexagonal wires having silver sheaths containing $YBa_2Cu_3O_7$ cores, can similarly be bundled and consolidated in a conducting tube of Cu, Ag, or Ag-Pd by hot isostatic pressing techniques, as taught by U.S. Pat. No. 5,017,553 (Whitlow et al.) filed on Jan. 25, 1990 (W.E. Case 55,279).

None of these processes, however, solved the unique problems associated with processing metals with ceramics. Silver sheathed, ceramic oxide superconducting wires, made, for example by the process of Jin et al., exhibit the following disadvantages: filament uniformity and electrical continuity are far from ideal, due to the inherent difficulties in co-processing a soft metal and a ceramic, and the metal sheathed ceramics are not resistant to damage from mechanical strain occurring in bending or forming operations. Also, ambient pressure heat treatments which involve melting of some core material result in core microstructures which are porous, due to gas evolution and the changes from the solid to the liquid and back to the solid state. This voidage within the core results in a reduced current density for the superconducting wire.

What is needed is a method of processing metal sheathed ceramics having superconducting capability, which solves problems of processing soft metal and ceramic, provides resistance to subsequent forming operations, and which provides a consolidated, void free, crack free ceramic core. It is a main object of this invention to provide such a process.

SUMMARY OF THE INVENTION

Accordingly, the invention resides in a method of consolidating the ceramic core of a metal sheathed ceramic wire having superconducting capability comprising the steps: providing core pellets of pressed particles of metal oxides, placing the pellets within a metallic sheath, reducing the cross-section of the sheathed pellets to provide a metallic sheath-ceramic oxide core composite; and heat treating the composite, characterized in that, after reducing the cross-section to provide a composite, the composite is sealed in a container assembly under vacuum conditions and hot isostatically pressed at a temperature over 600° C., said temperature being sufficient to initiate the onset of melting of the metal oxide core, said temperature being below the melting point of the sheath, and then annealing the pressed composite in a source of oxygen at a temperature from 770° C. to 870° C. for at least 40 hours.

Preferably, the hot isostatic pressing is from 352 kg/cm² (5,000 psi) to 3,172 kg/cm² (45,000 psi) over a period of from 5 minutes to 20 minutes in an inert gas environment, where the temperature is from the onset of the melting temperature to 55° C. above the onset of melting of the metal oxide core. The preferred powders for use as pellets are of the Bi.Sr.Ca.Cu.O; and Bi.Pb.Sr.Ca.Cu.O types. This method provides improved current densities and a uniformly consolidated core having substantially no voids.

BRIEF DESCRIPTION OF THE DRAWINGS

In order that the invention can be more clearly understood, convenient embodiments thereof will now be described, by way of example, with reference to the accompanying drawings in which.

DESCRIPTION OF THE PREFERRED EMBODIMENTS

Figure 1:
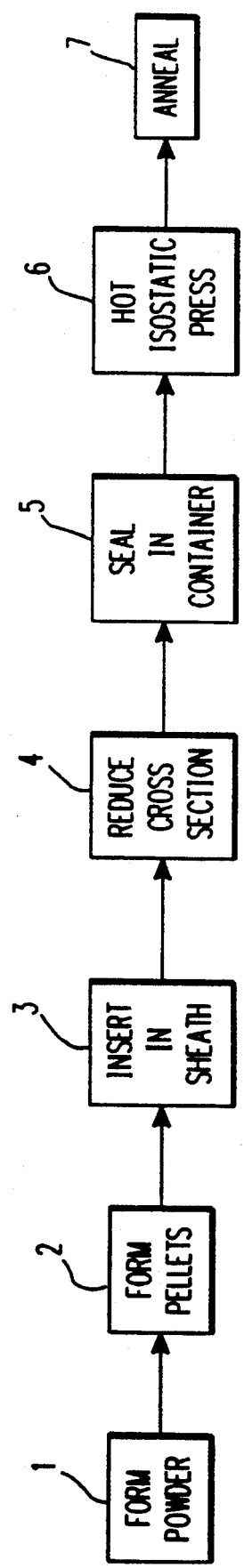
FIG. 1, which best illustrates the invention, is a block diagram showing the method of this invention.

The ceramic oxide particles which are useful in the method of this invention comprise alkaline earth metal-copper oxides, preferably selected from the group consisting of bismuth containing, alkaline earth metal-copper oxides or thallium containing, alkaline earth metal-copper oxides, such as (Bi or Tl)$_x$(Ba or Sr)$_2$Ca$_{n-1}$Cu$_n$O$_z$ ceramics, described by P. Haldar et al., in *Science*, Vol. 241, September 1988, pp. 1198–1200. Optional amounts of metal elements, preferably Pb can also be present in the ceramic composition. Alkaline earth metals include Mg, Ca, Sr, Ba, and their mixtures. The powder material may also contain minor amounts, up to 10 weight % of noble metal additives, such as silver, gold, their oxides and mixtures, added separately as powder in elemental form. The most preferred ceramic materials are Bi$_2$Sr$_2$Ca$_1$Cu$_2$O$_y$, Bi$_2$Sr$_2$Ca$_{Cu3}$O$_y$, (Bi,Pb)$_2$Sr$_2$Ca$_2$Cu$_3$O$_y$, and Tl$_2$Sr$_2$Ca$_2$Cu$_3$O$_y$ type systems, where y is usually from 7 to 8. All of these ceramics have a melting point range from about 830° C. to 940° C., well below the melting point of 960° C. of silver, the most preferred sheath material.

The alkaline earth metal-copper oxide based ceramic will be chemically formed from appropriate amounts of constituent metal oxides, screened to provide appropriately sized particles, usually less than 2 micrometer (20,000 Angstroms) diameter, preferably less than 0.1 micrometer diameter, and cold press pelletized for use as a core in a metal sheath. Pelletizing will usually take place at a pressure of from approximately 70 kg/cm$^2$ (1,000 psi) to 3,525 kg/cm$^2$ (20,000) psi, in a uniaxial press, to provide a porosity of between 20% and 60% (40% to 80% of theoretical density).

The compressed pellets are then placed in long, thin-walled, metal conductor sheaths, to provide a composite. The composite is then reduced in cross-section prior to hot isostatic pressing. In the hot isostatic press, the composite is placed under argon pressure externally, to insure collapse of the conductor sheath in an evacuated container assembly under the isostatic pressure, and to complete densification of the core and sheathed wire. The sheath should be thin enough so that subsequently applied isostatic pressure exceeds the sheath material yield strength at the hot isostatic pressing temperature. The pellets may be of rectangular cross-section, in which case the pellets can be placed between flat metal sheets, used as a sheath and processed by rolling. The pellets most usually are of circular cross-section, in which case the pellets can be placed into a metal tube, used as a sheath. The sheets or tube can be made of a metal such as Ag, or Cu coated with oxygen impermeable Ni or Au, or the like, where the coating, if used, would contact the pellet. A composite sheath can also be utilized, for example, an inner wall dispersion hardened by addition of minor amounts of oxides such as Al$_2$O$_3$, BeO, ZrO$_2$ and the like, and a standard ductile outer sheath.

As shown in FIG. 1, appropriate metal oxide powders, where carbonates will be considered oxides for simplicity in this specification, such as BaCO$_3$, and oxides of Sr, Ca, Cu and Pb and CuO for Bi based ceramics, are mixed (step 1) in mole ratios necessary to provide superconducting stoichiometry in the final sintered pellet, usually reacted to produce the desired ceramic superconductor material, and pressed (step 2) to provide core pellets of ceramic oxides. Of course, any other method of forming or providing the desired superconductor powder can be used.

The compressed pellets are then placed within a flat, or tubular, metal sheath (step 3). The sheathed pellets are then reduced in cross-section (step 4), as by rolling, drawing through a die or extruding, or the like, to provide a metallic sheath-ceramic oxide core composite of tubular, oval, hexagonal, or more complicated cross-section, with suitable intermediate anneals, such as 30 minutes at 450° C. in an inert atmosphere. For example, the sheathed pellets may be cold swaged through a series of dies down to 3.8 mm (0.15 inch) diameter round wire in steps of 0.5 mm. The round wire may then be cold extruded from round to hexagonal cross-section by one pass to 3.0 mm if desired. The sheathed-ceramic oxide core composites, if end sealed at this point, are cut so than the core can be placed under a vacuum in subsequent pressing.

The composite is placed in container assembly, a vacuum is applied, and the container assembly is sealed (step 5). The assembly and sheathed-ceramic core composite within the assembly is then hot isostatically pressed (step 6), preferably at from 352 kg/cm$^2$ (5,000 psi) to 3,172 kg/cm$^2$ (45,000 psi), most preferably from 846 kg/cm$^2$ (12,000 psi) to 1,410 kg/cm (20,000 psi), at a temperature over 600° C. for 5 minutes to 20 minutes in an inert gas environment, such as argon, at an onset core melting temperature. The preferred temperature will be from the onset of metal oxide core melting, to 55° C. above the onset of melting of the metal oxide core. The most preferred temperature will be from 1° C. above to 10° C. above the onset of melting of the metal oxide core.

By "hot isostatic pressing" is meant pressing at a temperature over the generally accepted sintering temperature of the powder in the core, so that fusion flow, and preferably, melt flow is achieved, and where the pressing is in all directions at the same time, usually by a pressurized gaseous medium acting through a compressible sleeve and outer canister container assembly combination, as distinguished from mechanical, two-sided, uniaxial pressing. This combination of simultaneous heat and pressure results in the core achieving excellent bonding to the sheath and achieving a substantially voidless, near theoretical density cross-section by plastic flow of the lower melting powder. As a result of this hot isostatic pressing there is a 1% to 20% reduction in cross-section of the core-sheath composite, preferably a 5% to 20% reduction. Under 1% reduction, void reduction will be minimal, over 20% reduction, the sheath may infiltrate into the core possibly affecting the superconducting effect. The resultant, pressed composite will usually be flat, cylindrical, hexagonal, or any other desired shape.

Figure 2:
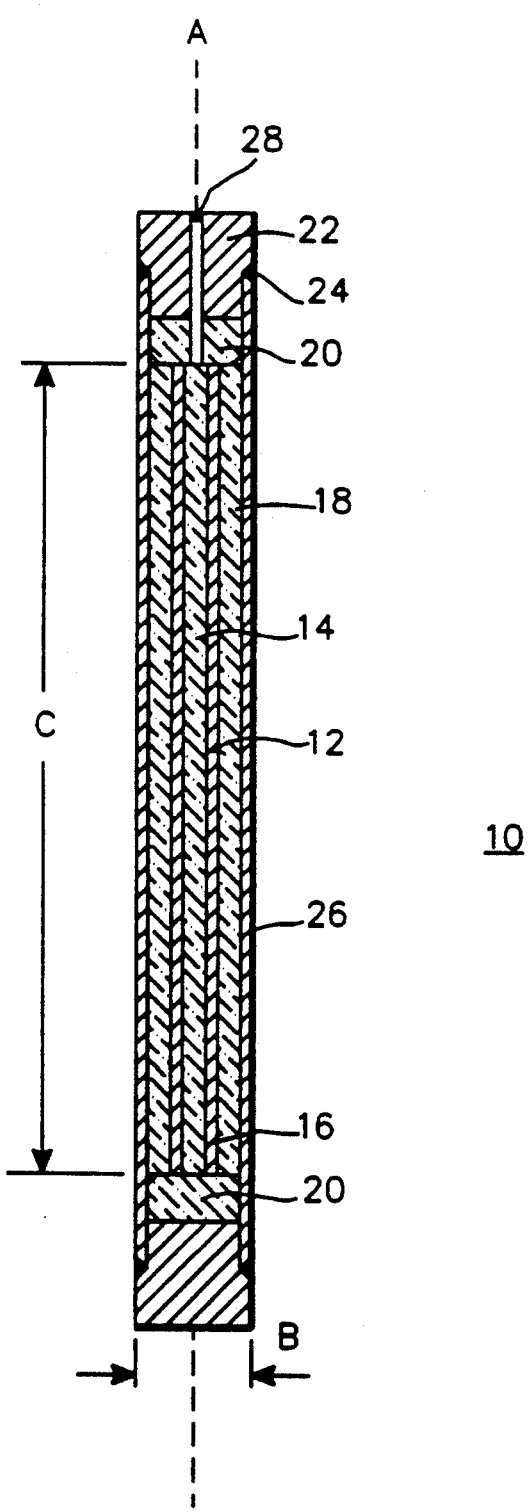
FIG. 2 is a longitudinal-sectional view of one example of a container assembly for use in a hot isostatic press assembly in the method of this invention.

One useful assembly 10 for supporting a circular composite core-sheath wire in the hot isostatic pressing step is shown in FIG. 2. The sheath 12 is shown containing a ceramic oxide superconductor wire core 14, which is not sealed in the wire sheath 12 at each end 16. Surrounding the sheath 12 is, for example, 40% to 95% porous (5% to 60% of theoretical density) graphite, boron nitride, or the like high temperature resistant sleeve 18, completely surrounding the composite, acting as compressing/separation medium, having an inside diameter slightly less than the outside diameter of the sheathed wire or flat wire tape. Thus, there is to begin with, a very tight fit between the sheath 12 and the sleeve 18. As part of the sleeve, graphite, boron nitride, or the like compression spacers 20 are disposed at the top and bottom of the assembly, topped by metallic plugs 22 welded at points 24 to a surrounding, thin carbon or stainless steel or other suitable metal canister 26. The internal compressing/separation medium sleeve 18 and the surrounding metal canister 26, with spacers 20 and plugs 22 comprise the container assembly. The thickness of canister 26 is such that it compresses easily at hot isostatic temperature and pressure.

A variation on this theme employs a graphite or "boron nitride split sleeve with a cavity premachined to accommodate a round, hexagonal or rectangular cross-section conductor. Typically, this split sleeve would be sectioned lengthwise along the A—A central plane.

This container assembly is weld sealed, as by electron beam welding, under vacuum at point 28 to place the core 14 under vacuum and ease its compression, and hot isostatically pressed at a temperature close to or just above the melting point of the pressed core powder. Since the core has been previously compacted in the A—A (axial) direction, and since the core fit into the sheath will under any circumstances not be perfect, providing a large number of voids between the outside diameter of the core and the inside diameter of the sheath, the isostatic pressing, particularly in the circumferential or inward direction transverse to A—A of the core pellets and sheath will be critical in providing intimate contact between the core pellets and sheath at their interface, eliminating voids at the core-sheath interface and further compacting into the center of the core. Even though previous uniaxial pressing of the pellets in the A—A direction and fabrication by metal working processes described previously may densify up to 80%, and further hot uniaxial pressing in the A—A direction could densify much further, due to the particle packing efficiency complete densification even with melting might not be possible without circumferential pressing transverse to the axis of the core and sheath.

In a variation to the assembly shown in FIG. 2, the sheathed wire or other composite shape could be wound around a heat and pressure resistant mandrel, such as silver or boron nitride, which is itself part of the hot isostatic pressing assembly, including a boron nitride outer jacket. The shape could be set in its final configuration such as a coil in conforming grooves in the mandrel assembly and then hot isostatically pressed.

After the hot isostatic pressing, the assembly is disassembled, the wire or other shape is removed and further heat treated in an annealing step (step 7) in a furnace in a source if oxygen, such as air, or a reduced partial pressure of oxygen environment, such as nitrogen with 1% to 5% oxygen, at a temperature from 770° C. to 870° C., for at least 40 hours, preferably from 40 hours to 200 hours, most preferably 40 hours to 80 hours. This long annealing process at relatively low temperatures is essential to help permit the nucleation and growth of the superconducting phase from the melt treated core structure, especially for $Bi_2Sr_2Ca_1Cu_2O_7$ core material, and to maximize current density of the resulting core.

After annealing, the wires if necessary could be extruded from round to hexagonal cross-section, bundled with similar wires within a tube, consolidated, and further drawn, rolled, or the like,.

The following Example further illustrates this invention and is not to be considered in any way limiting.

EXAMPLE

Fine particles of $Bi_2Sr_2Ca_1Cu_2O_y$ (M.P. range = 870° C. to 900° C.) were cold pressed into pellets about 45% to 50% porous. These were inserted into a silver tube (0.95 cm outside diameter, 0.63 cm inside diameter, M.P. = 960° C.) and processed into nominally 0.15 cm (0.06 inch) wire through a series of swaging, extrusion or drawing, and annealing (450° C.) steps. A length of this Ag sheathed wire was then vacuum sealed into a container assembly similar to that shown in FIG. 2. This container assembly, including the sheathed wire was then hot isostatically pressed at 1,057 kg/cm$^2$ (15,000 psi) for approximately 6 minutes at 920° C., in argon gas, using the assembly shown in FIG. 2. Dimension B was 0.792 cm, and dimension C was 7.62 cm. The argon gas pressure compacted the thin outer steel canister and the porous, compressible, graphite plugs, spacers and sleeve to transmit pressure in all directions, including circumferentially transverse to the axis of the core pellets and cause plastic flow in the core and intimate contact of the core with the sheath at their interface.

After pressing, the assembly was disassembled and the composite wire, reduced in diameter from 0.144 cm (0.057 inch), an 8% reduction in cross-section, was placed in an annealing furnace. It was then annealed in ambient air for 60 hours at 820° C.±40° C., and then brought to room temperature. The current density of the pressed, annealed wire was measured at 4.2K and zero magnetic field, and found to be over 75,000 A/cm$^2$. In a magnetic field of 2.5T, at 4.2 K, the same wire had a current density over 27,000 A/cm$^2$. A cross-sectional micrograph of this wire filament at 50X magnification showed almost complete absence of voids in the core, excellent interface contact between the core and the sheath, absence of core cracks, and relative uniformity of the core diameter. This provided a substantially void free core and high current density conductors with enhanced filament dimensional uniformity and supercurrent continuity.

We claim:

1. A method of producing a high temperature ceramic superconductor comprising the steps of:
   providing core pellets of pressed particles of metal oxides selected from the group consisting of Bi.Sr.Ca.Cu.O and Bi.Pb.Sr.Ca.Cu.O,
   placing the pellets within a metallic sheath, thereby forming a sheath-pellet structure,
   reducing the cross-section of the sheath-pellet structure, thereby providing a composite comprising said metallic sheath and a ceramic oxide core, and heat treating the composite,
   sealing the composite in a container assembly, having a high temperature resistant compression/separation medium containing 40% to 95% of a porous material selected from the group consisting of particulate material and fibrous material, and a thin metal outer portion surrounding the metallic sheath, under vacuum conditions, thereby placing the core under vacuum to ease compression thereof, and then hot isostatically pressing the composite through the compression/separation medium at from 352 kg/cm$^2$ to 3,172 kg/cm$^2$, and at a temperature over 600° C. thereby initiating melting of the ceramic oxide core but not of the metallic sheath while causing plastic flow of said metallic sheath, and thereby causing from 1% to 20% reduction in the cross-section of the composite and intimate contact between the core and the sheath at their interface while compressing said core to near its theoretical density and thus eliminating voids therein, and then, composite and compression/separation medium, and then annealing the composite in a source of oxygen, at a temperature from 770° C. to 870° C. for 40 hours to 200 hours, thereby maximizing current density of the core.

2. The method of claim 1, including performing said hot isostatic pressing step for 5 minutes to 20 minutes in an inert gas environment.

3. The method of claim 1, where the sheath is a silver tube, the core pellets are of circular cross-section, with the hot isostatically pressure step causing circumferential pressing transverse to the axis of the core and sheath.

4. The method of claim 1, where the sheath is a flat sheet, the core pellets are of rectangular cross-section, with the hot isostatically pressing step causing inward pressing transverse to the axis of the core and sheath.

5. The method of claim 1, including winding the composite around a heat and pressure resistant mandrel thereby forming a coil configuration in hot isostatic pressing.

6. The method of claim 1, where the ceramic core pellets are Bi.Sr.Ca.Cu.O selected from the group consisting of $Bi_2Sr_2Ca_1Cu_2Oy$ and $Bi_2Sr_2Ca_2Cu_3Oy$, where y ranges from 7 to 8.

* * * * *